PERMEABILITY-TUNED VARIABLE-FREQUENCY AMPLIFIER

Filed June 21, 1945

INVENTOR
Ralph A. Varone
BY H. G. Grover
ATTORNEY

Patented Aug. 8, 1950

2,517,741

UNITED STATES PATENT OFFICE 2,517,741

PERMEABILITY-TUNED VARIABLE-FREQUENCY AMPLIFIER

Ralph A. Varone, Audubon, N. J., assignor to Radio Corporation of America, a corporation of Delaware Application June 21, 1945, Serial No. 600,728

7 Claims. (Cl. 179—171)

The present invention relates in general to tunable amplifier circuits, and more particularly to permeability-tuned, variable-frequency amplifier circuits such as may be used in radio receivers.

A disadvantage of inductively-coupled, condenser-tuned circuits of the prior art is the fact that both the band-width and the gain of such circuits vary with frequency over the tuning range. More specifically, with such circuits the band-width decreases and the gain goes down at the low frequency end of the range.

It is therefore one of the main objects of the invention to provide an amplifier circuit of the type mentioned above which has substantially constant band-width and constant gain over its tuning range.

Another object of the invention is to provide in a coupling system between the output of one electron discharge device and the input of another, a pair of tunable circuits, the coefficient of coupling of which is progressively increased with tuning of the circuits from the high to the low frequency ends of the tuning range to provide substantially constant band-width.

A further object of the invention is to provide in the coupling system above mentioned, a fixed-tuned circuit which has a gain characteristic complementary to that of the tunable circuits to provide substantially constant gain for the system as a whole.

A still further object of the invention is to effect the tuning of the pair of circuits in the above coupling system by means of a pair of movable ferro-magnetic cores, each associated with the coil of its respective circuit, adjustment of which concomitantly produces a desired variation in the degree of coupling between said circuits.

The novel features characteristic of my invention are set forth with particularity in the appended claims. The invention itself, however, both as to its organization and mode of operation together with further objects and advantages thereof, will best be understood by reference to the following description taken in connection with the accompanying drawing, in which:

Figure 1:
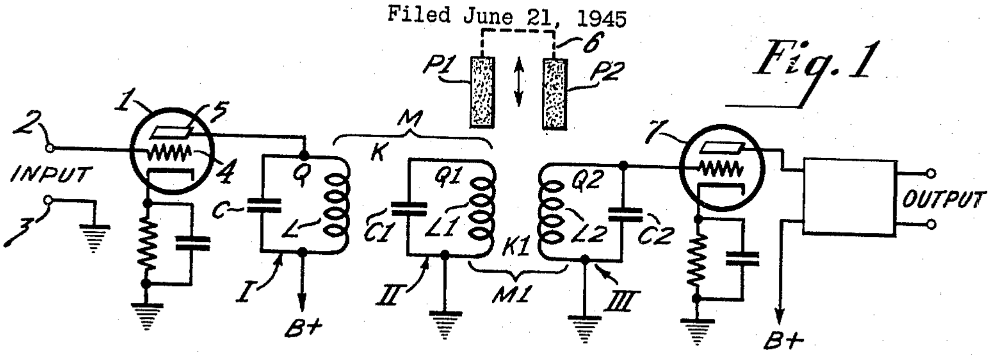
Fig. 1 is a circuit diagram of a tunable amplifier according to the invention.

Referring to Fig. 1 there is shown at 1 a first electron discharge tube amplifier which may be of any suitable type and which may be the first tube of a radio receiving system. Signals to be amplified, such as from an antenna or other source, not shown, are applied to the input terminals 2 and 3 which are connected respectively to the signal grid 4 of the tube 1 and ground. Connected to anode 5 of this tube is a fixed-tuned circuit I which consists of an inductance L and a shunt condenser C. Inductively coupled to inductance L is a second inductance $L_1$ shunted by a condenser $C_1$ which constitute a tunable circuit II, the frequency of which is adapted to be varied over the operating range, such as the broadcast band or any other desirable band by means of a ferro-magnetic core $P_1$ arranged for axial movement with respect to coil $L_1$, as known in the art. A third circuit II includes a coil $L_2$ and a shunt condenser $C_2$, coil $L_2$ being inductively coupled to coil $L_1$ of circuit II. Coil $L_2$ also is provided with a ferro-magnetic core $P_2$ which is arranged for axial adjustment with respect thereto to vary the frequency of circuit III. The two cores $P_1$ and $P_2$ are arranged to be actuated in unison by means represented schematically by the dash line 6 so that circuits II and III may be tuned simultaneously over the range of operating frequencies. Circuit III constitutes the input to a second electron discharge tube 7 of any suitable type and may be an additional amplifier, or the converter stage if the receiver is of the superheterodyne type.

Circuits II and III are tuned to the same signal frequency by the permeability tuners $P_1$ and $P_2$. Mutual inductance $M_1$ is present between coils $L_1$ and $L_2$. Mutual inductance M is present between coils L and $L_1$ and may also be present between coils L and $L_2$. The mutual inductance between L and $L_1$ and between $L_1$ and $L_2$ may be present individually or simultaneously.

Practically constant band-width is obtained by increasing the coefficient of coupling $K_1$ between $L_1$ and $L_2$ as the frequency of circuits II and III is decreased. The coefficient of coupling $K_1$ is increased because of the more intense magnetic field between coils $L_1$ and $L_2$ as the tuning cores $P_1$ and $P_2$ move into their respective coils $L_1$ and $L_2$. $Q_1$ and $Q_2$ of circuits II and III, respectively, may also increase thereby causing $$K_1\sqrt{Q_1Q_2}$$

to increase as the frequency is decreased.

Figure 3:
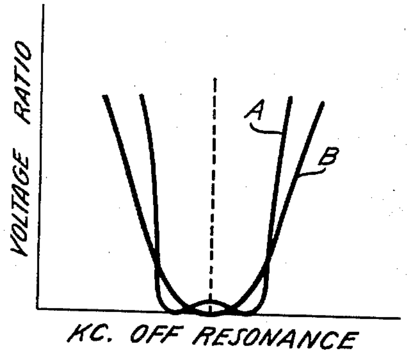
Fig. 3 illustrates typical selectivity curves obtained with the circuits of Figs. 1 and 2.

The general shape of the selectivity curves of a single stage is shown in Fig. 3, curve A depicting the selectivity at the low frequency end of the band, and curve B that at the high frequency end. It will be noted that the region of constant band width is substantially the same at both ends of the range.

Figure 4:
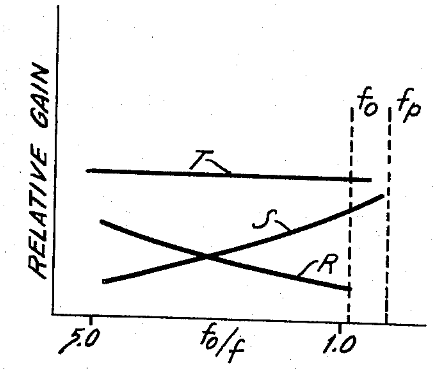
Fig. 4 illustrates gain characteristic curves which will serve to explain the invention.

The coupled circuits II and III inductively coupled by $M_1$, when used alone in an amplifier stage, have a gain characteristic that rises as the frequency decreases. The frequency is decreased by the permeability tuners $P_1$ and $P_2$. This is so because the L/C ratio increases as the frequency decreases, causing the impedance across circuit II to increase. This is illustrated graphically by the curve R in Fig. 4, where $f_0$ is the highest frequency in the tuning range and $f$ any other frequency in that range.

If circuit I is made resonant to a frequency higher than the highest frequency $f_0$ in the tuning range, the gain characteristic of the amplifier using this circuit alone rises as the frequency increases, being a maximum at its resonant frequency. The induced voltage in circuit II due to the presence of the mutual coupling M between coils $L_1$ and L increases in a similar way as the frequency is increased. The relative gain characteristic of circuit I alone is shown by the curve S where $f_p$ is the resonant frequency of circuit I and higher than $f_0$. $f$ is any other frequency in the tuning range of the amplifier. By utilizing the three coupled circuits I, II, and III as described above, the combined result obtained is shown by gain characteristic curve T. The following data was taken on a typical amplifier stage:

| Frequency | Gain | Band-width at attenuation point of 3DB |
|---|---|---|
| *Kc.* | | *Kc.* |
| 600 | 7.9 | 26.2 |
| 700 | 10.0 | 28.0 |
| 800 | 11.5 | 28.0 |
| 900 | 11.5 | 26.2 |
| 1,000 | 11.5 | 26.2 |
| 1,100 | 10.0 | 24.0 |
| 1,200 | 7.3 | 30.7 |

Figure 2:
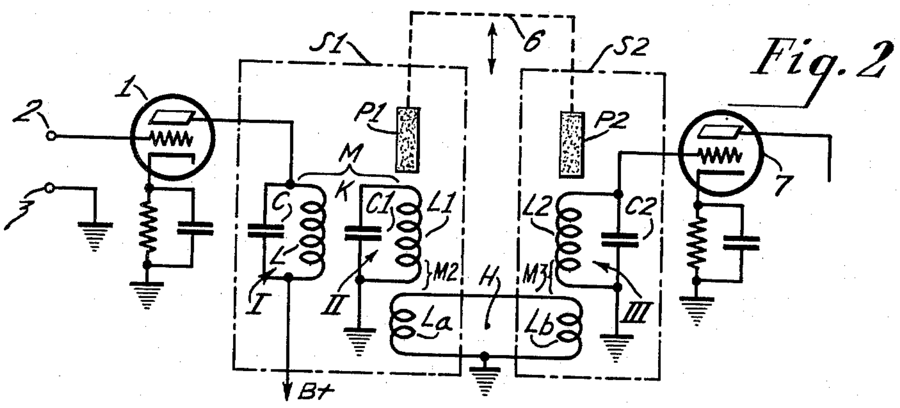
Fig. 2 is a modification of the amplifier shown in Fig. 1.

A modification of the tunable amplifier described above is shown in Fig. 2, wherein the same reference characters are employed to designate the same or similar elements as in Fig. 1. For compactness, circuits I and II in Fig. 2 are enclosed in a shield can $S_1$ and circuit III is enclosed in a second shield can $S_2$. Magnetic coupling between circuits II and III is obtained by means of a link circuit H having a coil $L_a$ in coupled relation with coil $L_1$ of circuit II and a coil $L_b$ in coupled relation with coil $L_2$ of circuit III. The coefficient of coupling K′ between circuits II and III is:

$$\frac{M_2 M_3}{(L_a+L_b)L_1 L_2}$$

where $M_2$ is the mutual inductance between $L_1$ and $L_a$ and $M_3$ is the mutual inductance between $L_2$ and $L_b$. The results obtained with the amplifier of Fig. 2 are essentially the same as those obtained with the amplifier of Fig. 1.

It will be seen therefore that the invention embodies the following features in a variable-frequency, permeability-tuned amplifier that has two tuned circuits at the signal frequency and one tuned circuit at a frequency higher than the highest frequency in its tuning range:

1. Constant band-width, obtained by increasing the coefficient of coupling between the coils of the two tunable circuits.

2. Constant gain, obtained by combining a circuit having a rising gain frequency characteristic with one having a dropping gain frequency characteristic.

While I have shown and described certain preferred embodiments of my invention, it will be understood that various modifications and changes will occur to those skilled in the art without departing from the spirit and scope of this invention. I therefore contemplate by the appended claims to cover any such modifications as fall within the true spirit and scope of my invention.

What I claim is:

1. A tunable amplifier system coupled to a source of signals having a predetermined range of operating frequencies and providing substantially constant band-width and gain over said range of operating frequencies comprising a resonant circuit fixed-tuned to a frequency above the highest frequency of said range having a rising gain characteristic with tuning of the system to higher frequencies, a pair of coupled tunable circuits, at least one of which is coupled to the first resonant circuit, having a declining gain characteristic with tuning of the system to higher frequencies, and a pair of simultaneously adjustable ferro-magnetic cores for tuning said pair of circuits through said range of operating frequencies, and for progressively increasing the coefficient of coupling between said coupled circuits with tuning of said circuits to lower frequencies and vice-versa.

2. A tunable interstage coupling system coupled to a source of signals having a predetermined range of operating frequencies and providing substantially constant band-width and gain over said range of operating frequencies comprising a resonant circuit connected in the output of one stage, said circuit being fixed-tuned to a frequency above the highest frequency of said range and having a rising gain characteristic, a pair of inductively coupled tunable circuits, at least one of which is inductively coupled to the first resonant circuit, having a declining gain characteristic, one of said coupled circuits constituting the input of the subsequent stage, and means including a pair of ferromagnetic cores for tuning said coupled circuits and for progressively increasing the coefficient of coupling between said coupled circuits with adjustment of the tuning thereof towards lower frequencies.

3. In a signaling system wherein a plurality of carrier waves having different frequencies within a predetermined range are respectively modulated by signals having substantially uniform frequency band widths, a tunable system coupling a source of said signal-modulated carrier waves to a utilization circuit and having a substantially constant band width corresponding to said signal frequency band width and a substantially constant gain at all of said carrier wave frequencies, said coupling system comprising, a first resonant circuit tuned to a frequency above said range of carrier frequencies, thereby having a gain varying at a predetermined rate directly with said carrier wave frequencies, mutually coupled second and third resonant circuits tunable to any selected one of said carrier wave frequencies, thereby having a gain varying substantially at said predetermined rate inversely to said carrier wave frequencies, whereby to maintain the net gain of said coupling system substantially constant for all carrier wave frequencies, means coupling said first resonant circuit to one of said mutually coupled resonant circuits, and simultaneously movable ferromagnetic cores for tuning said second and third resonant circuits, thereby varying the coefficient of said mutual coupling inversely to variations of the resonant frequency of said second and third resonant circuits, whereby to maintain a substantially constant signal frequency band width of said coupling system for all carrier wave frequencies.

4. A tunable coupling system as defined in claim 3, in which said resonant circuits each comprise a parallel connection of a coil and a capacitor, and said ferromagnetic cores are mounted within the respective coils of said mutually coupled resonant circuits.

5. A tunable coupling system as defined in claim 4, in which said first resonant circuit is coupled to said source, and to said second resonant circuit, and said third resonant circuit is coupled to said utilization circuit.

6. A tunable coupling system as defined in claim 5, in which the coupling between said resonant circuits is predominantly inductive.

7. A tunable coupling system as defined in claim 6, in which said first and second resonant circuits are shielded from said third resonant circuit, and a link circuit provides the inductive coupling between said second and third resonant circuits.

RALPH A. VARONE.

REFERENCES CITED

The following references are of record in the file of this patent:

UNITED STATES PATENTS

| Number | Name | Date |
|---|---|---|
| 1,881,284 | MacDonald | Oct. 4, 1932 |
| 1,910,399 | MacDonald | May 23, 1933 |
| 2,051,012 | Schaper | Aug. 11, 1936 |
| 2,104,792 | Crossley et al. | Jan. 11, 1938 |
| 2,106,226 | Schaper | Jan. 25, 1938 |
| 2,296,098 | Farfel et al. | Sept. 15, 1942 |

FOREIGN PATENTS

| Number | Country | Date |
|---|---|---|
| 2,988 1931 | Australia | Feb. 9, 1932 |
| 383,668 | Great Britain | Nov. 24, 1932 |